United States Patent [19]
Taillet

[11] 4,316,791
[45] Feb. 23, 1982

[54] DEVICE FOR CHEMICAL DRY ETCHING OF INTEGRATED CIRCUITS

[75] Inventor: Joseph Taillet, Boulogne, France

[73] Assignee: Office Nationale d'Etudes et de Recherches Aerospatiales, Chatillon, France

[21] Appl. No.: 179,788

[22] Filed: Aug. 20, 1980

[30] Foreign Application Priority Data

Aug. 22, 1979 [FR] France ............................... 79 21128

[51] Int. Cl.³ .................... C23C 15/00; C23F 1/00
[52] U.S. Cl. .............................. 204/298; 204/192 E; 156/345; 156/643
[58] Field of Search ............... 204/192 E, 298; 156/345, 643

[56] References Cited

U.S. PATENT DOCUMENTS

| 4,160,690 | 7/1979 | Shibagaki et al. | 156/643 |
| 4,222,838 | 9/1980 | Bhagat et al. | 204/192 E |
| 4,229,233 | 10/1980 | Hansen et al. | 148/1.5 |
| 4,233,109 | 11/1980 | Nishizawa | 156/643 |
| 4,253,907 | 3/1981 | Parry et al. | 156/643 |

OTHER PUBLICATIONS

B. N. Chapman et al., "Triode System for Plasma Etching", *IBM Tech. Disc. Bull.*, vol. 21, p. 1197, (1978).
S. Bhattacharaya, "System for Varying the Directionality in Plasma Etching", *IBM Tech. Disc. Bull.*, vol. 20, p. 991, (1977).
B. N. Chapman, "Plasma Etching of a Positively Biased Wafer", *IBM Tech. Disc. Bull.*, vol. 22, pp. 1175–1176, (1979).

*Primary Examiner*—Aaron Weisstuch
*Attorney, Agent, or Firm*—Lowe, King, Price & Becker

[57] ABSTRACT

Apparatus for dry chemical etching caused by ion bombardment of a substrate placed in a vacuum chamber. The substrate is in contact with an electrode, connected to a high frequency bias voltage source having one terminal connected to a ground of the chamber. The etchants are produced in the form of plasma by an electrical discharge maintained in the chamber containing a gas or a suitable gaseous mixture. The plasma is produced by a microwave generator and the bias voltage by means of a high frequency source. The respective amplitudes and frequencies of the two sources enable the base of a groove on an electronic circuit to be etched without erosion of the groove.

4 Claims, 2 Drawing Figures

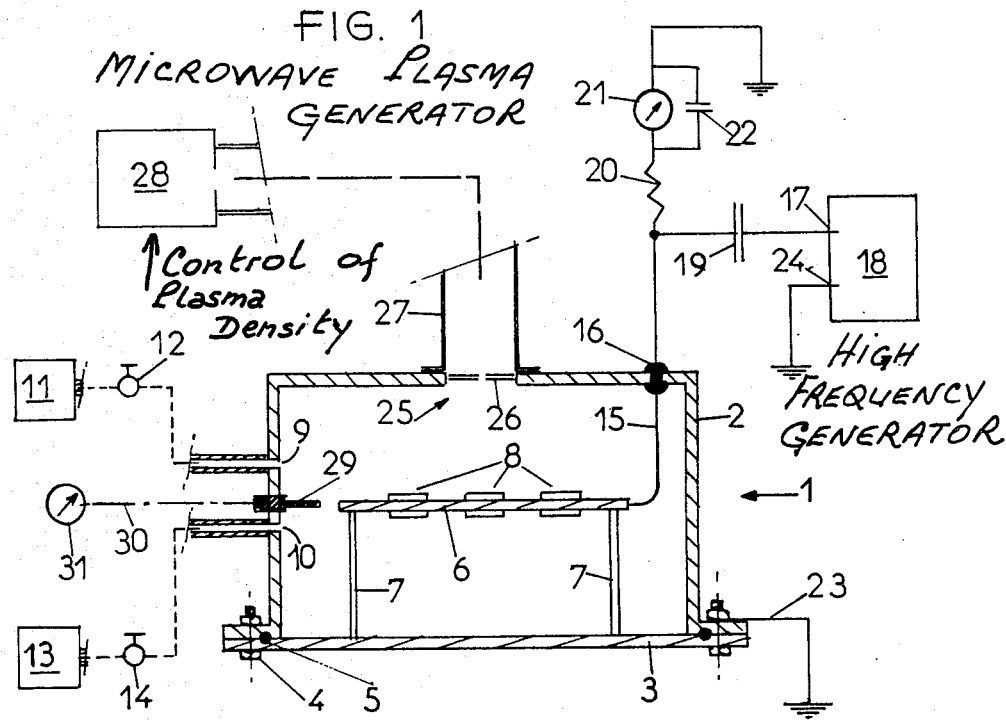
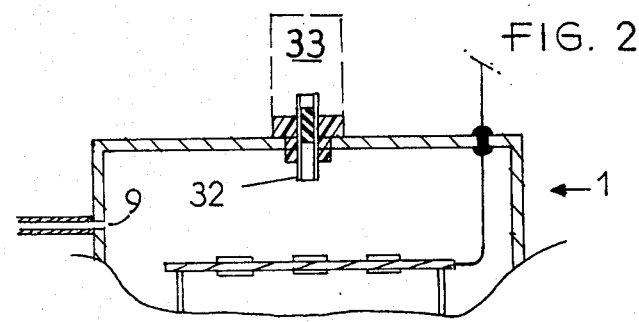

DEVICE FOR CHEMICAL DRY ETCHING OF INTEGRATED CIRCUITS

BACKGROUND OF THE INVENTION

1. Field of the Invention

The present invention relates to the field of the manufacture of integrated circuits and more particularly to the technique of dry chemical etching of the circuits.

Several types of etching methods enable fine patterning of integrated circuits to be obtained. The most widespread are electron beam etching methods and photoetching techniques using dry chemical etching.

2. Description of the Prior Art

Dry chemical etching methods utilize a reagent element source produced in the form of plasma generated by a high frequency electrical discharge maintained in a vacuum chamber containing a gas or a suitable combination of gases under a low pressure. The discharge provides a plasma producing radicals, ions and electrons which may, with a substrate, provide chemical reactions leading to etching.

Apparatuses which enable this dry chemical etching method to be applied comprise a vacuum chamber with an internal electrode supporting the substrate to be etched, which electrode is maintained at the potential of a high frequency power source. The chamber includes metal surfaces constituting a second electrode that is grounded to the high frequency source.

When the HF source is in operation, the gas contained in the chamber is ionised and becomes a plasma. An ion bombardment of the substrate takes place as a result of the existence of a direct electrical potential of the plasma, this potential being sufficiently positive with respect to the substrate.

The above-described prior art is disclosed in an article of Yasuhiro HORIIKE and Masahiro SHIBAGAKI entitled "A New Chemical Dry Etching" published in Proceedings of the 7th Conference on Solid State Devices, Tokyo, 1975, Supplement to Japanese Journal of Applied Physics, Vol. 15 No. 7, 1975, pages 13-18. The Horiike et al article discloses a method for the selective etching of a material by reagent ions.

Recent experiments show that etching is linked to the ion bombardment of a groove base by energetic particles of some hundreds of electron volts, as shown by M. F. WINTERS in the Journal of Applied Physics 49 (10), 1978.

The inventor's work in the field of electrical discharges has enabled him to demonstrate that if these discharges are applied to chemical etching, it is possible, in certain conditions, to strike the discharge to etch with an anisotropic nature, i.e. a base of the groove is etched much more rapidly that walls of the groove. A paper relating to the general properties of the plasma potential in a high frequency capacitive discharge has been published by the applicant in a report of the Academie des Sciences of Paris Volume 287 dated Dec. 18, 1978.

In a high frequency (HF) capacitive discharge, the plasma is maintained by passing an alternating current from a HF generator across sheaths which adjoin electrodes of the HF generator. This current imposes an alternating potential difference on the sheath. If the frequency of the current is sufficiently low and the power absorbed sufficiently high, the effective value $V_A$ of this alternating potential difference is much greater than the direct potential difference, $V_P$, coupled to an ambipolar diffusion of the direct discharge at the same electronic temperature.

As a result of this alternating potential difference, plasma electrons may be liberated very rapidly if the direct potential of this plasma is not sufficiently positive to retain these electrons; it has been shown that the direct potential difference, obtained by this effect, and similar to the behavior of a rectifier, is at least equal to $V_A\sqrt{2}$.

In addition, the thickness of the sheath is linked on one hand to this direct potential difference, to the electron density of the plasma and to its electronic temperature, by Child-Langmuir's law; the sheath thickness is, on the other hand, linked to $V_A$ by an equation which expresses the high frequency potential difference across the sheath as the product of the sheath impedance through the high frequency current. From these two equations it is possible to calculate the expression which gives the potential energy of the plasma ions, i.e. the energy which the ions bombarding the substrate would have if they succeeded in passing through the sheath without colliding with the neutral particles.

In these circumstances, the energy $W_+$ of the ions bombarding the substrate is given by the equation:

$$kT \times W_+ = 1.26\, (\omega_p/\omega)^2\, W_- \tag{1}$$

in which:

k is Boltzmann's constant,
T is the electronic temperature of the discharge;
$\omega/2\pi$ is the discharge frequency;
$\omega_p/2\pi$ is the frequency of the plasma linked to the electron density $n_e$ of the plasma by the equation $$\omega_p^2 = \frac{n_e e^2}{\epsilon_0 m}$$

in which e is the electron charge, m the mass of the electron and $\epsilon_0$ the dielectric permittivity of vacuum; $W_-$ is the energy with which the high frequency source provides the average electron of the discharge between two collisions with neutral particles.

Equation (1) may also be expressed as follows:

$$W_+ = (1.26)^2 \epsilon_0^{-2} e^2 m^{-1} (kT)^{-2} \omega^{-4} \lambda^2 (P/v)^2 \tag{2}$$

in which:

$\lambda$ is the mean free path of the electrons of the discharge and (P/v) is the high frequency power density, P is the power and v is the volume. In order for these equations to be applicable, it is further necessary for the thickness of the sheath $\rho_o$ of the discharge to be lower than the mean free path $\lambda_i$ of the ions of the discharge, i.e.

$$\rho_o \leq \lambda_i;\ \rho_o \leq \lambda/4 \tag{3}$$

In effect one has:

$$\lambda_i = \lambda/4 \tag{4}$$

whence $$\rho_o = m^{-\frac{1}{2}} (W_-)^{3/2} (kT)^{-1} \omega_p^2 \omega^{-3} \tag{5}$$

which may also be expressed:

$$\rho_o = \epsilon^{-1} {}_o e^2\, m^{-\frac{3}{2}} (P/v)^{3/2} n_e^{-\frac{1}{2}} (kT)^{-7/4} \lambda^{3/2} \omega^{-3} \tag{6}$$

and therefore:

$$4\epsilon_o^{-1} e^2 m^{-\frac{3}{4}}(P/v)^{3/2} n_e^{-\frac{5}{4}}(kT)^{-7/4} \lambda^{\frac{1}{2}}\omega^{-3} \leq 1 \qquad (7)$$

If the electrical discharge is maintained at the high frequency $(\omega/2)\pi$, this latter condition is often incompatible with the equations which give the particulate energy amounts of the discharge and which are complex equations depending on the specific properties of the gaseous mixtures used.

In effect, examination of Equations (2) and (7) suggests that an excessively high value should not be selected for $\omega$, to obtain an ion bombardment of sufficient energy (for example 100 eV) on the substrate. Condition (7) can only be obeyed in these circumstances if the value of the electronic density $n_e$ is suitably high and if the power density (P/v) is not too high. Simultaneously obtaining the required values is not in general feasible due to the energy balance equations mentioned above.

The following examples are cases in which the two conditions are not achieved simultaneously:

EXAMPLE 1 if $\omega/2\pi = 13.56$ MHz; P=200 Watts; $v=5\times10^{-3}m^3$;
$kT=8$ eV; $\lambda=3\times10^{-3}$ m; $n_e=4\times10^{16}$ m$^{-3}$;
$W-=1.25\times10^{-2}$ eV; $(\omega_p/\omega)=1.75\times10^4$;
$V_p=9500$ v and $\rho_o=1.5\times10^{-2}$m The condition $\lambda \geq 4\rho_o$ is not obeyed.

EXAMPLE 2 if $\omega/2\pi = 13.56$ MHz; P=20 W; $v=5\times10^{-3}m^3$;
$kT=8$ eV; $\lambda=3\times10^{-3}$m; $n_e=4\times10^{16}$ m$^{-3}$;
$W-=1.25\times10^{-3}$ eV; $(\omega_p/\omega)=1.75\times10^{-4}$;
$V_p=59$ V and $\rho_o=0.5\times10^{-3}$ m The condition $\lambda \geq 4\rho_o$ is achieved but it is not possible to obtain an electronic density of $4\times10^{16}$ m$^{-3}$ with a power of 20 W in $5\times10^{-3}$ m$^3$; this case may not therefore be achieved in practice.

SUMMARY OF THE INVENTION

The object of the invention is to provide a suitable means of dispensing with the restrictions linked to the energy balance equations dependent on the specific properties of the gaseous mixtures used. The restrictions are eliminated so it is possible to simultaneously obtain a sufficiently low value for the high frequency power density (P/v) and a sufficiently high value for the electron density $n_e$ so it is possible to satisfy condition (7).

In the method of the invention, integrated circuits are etched by exposing a substrate to be etched to a plasma produced in a leak-tight chamber containing a gas or a gaseous mixture under a low pressure. The substrate is disposed on an internal electrode biased by a high frequency voltage. The plasma is produced by a plasma source which is independent of the bias voltage source.

An apparatus for applying the method of the invention comprises a leak-tight metallic chamber containing a gas or a gaseous mixture under a low pressure. An internal electrode insulated from the chamber supports the substrate to be etched. A second electrode that connects of the internal electrode to the wall of the chamber is biased by a high frequency voltage source. A gas or a suitable gaseous mixture is introduced into the chamber as well as evacuation means. The wall of the chamber comprises a communication aperture with a plasma source.

In a first embodiment of the invention, the plasma source is a microwave plasma generator. In a further embodiment of the invention, the plasma source is a hollow cathode source.

BRIEF DESCRIPTION OF THE DRAWINGS

The invention will be described in detail with reference to the attached drawings, in which:

FIG. 1 is a diagrammatic illustration of one embodiment of the invention for etching integrated circuits; and FIG. 2 is a partial view of a further embodiment of the apparatus of the invention.

DESCRIPTION OF THE PREFERRED EMBODIMENTS

The apparatus comprises a metal vacuum chamber 1 which may be a tuned cavity or a simple tank, composed of bell jar 2 having a circular cross-section that is connected to base 3 by bolts 4, with the interposition of a leak-tight joint 5 between the bell jar and bolts.

Disposed in the interior of vacuum chamber is a metal electrode 6, electrically insulated from the exterior of the chamber by dielectric supports 7 fixed to the base 3. The electrode 6 is shaped as a thick disc on which the substrates 8 to be etched are fastened. Bell jar 2 includes parts 9 and 10 which respectively communicate with ducts connected to a pumping system 11 and a gas introduction system 13; systems 11 and 13 are respectively connected to ports 9 and 10 via adjustable valves 12 and 14.

The electrode 6 is electrically connected to one terminal of lead 15 that extends through bell jar 2 via an insulated, leak-tight grommet 16. A second terminal of lead 15 is connected by way of a capacitor 19 to a terminal 17 of a high frequency power source 18, having a frequency between 1 and 30 MHz, for example the standard frequency of 13.56 MHz. The second terminal of lead 15 is connected to ground via a series circuit including resistance 20 of high value, for example greater than 10 MΩ and ammeter 21 shunted by a capacitor 22.

The bell jar 2 forms a second, grounded electrode having a ground connection 23; terminal 24 of the high frequency source 18 also being connected to ground.

The vacuum chamber 1 includes means for establishing a fluid flow with a plasma source. For this purpose, the ceiling of chamber 1 has an aperture 25 provided with a coupling iris 26 and a wave guide 27 connected to a microwave generator 28, having a frequency that can be adjusted between 3 and 10 GHz.

On the internal wall of chamber 1 is a Langmuir probe 29, connected by lead 30 to a device for displaying the plasma density 31.

By means of the use of the above arrangement, only the Equations (3) and (4) must be considered with the following Equations (8) and (10). The operation can be described from the known equation:

$$\rho_o = \tfrac{2}{3}^{5/4} \epsilon_o^{\frac{1}{2}} e^{-\frac{1}{4}} n_e^{-\frac{1}{2}}(kT)^{-\frac{1}{4}} V_p^{\frac{3}{4}} \qquad (8)$$

If it is assumed that the starting data are:

1/ The pressure p under which it is intended to carry out the etching,

2/ The acceleration voltage $V_p$ considered optimum to obtain the desired rate of anisotropy.

The selection of a pressure p provides T without ambiguity. By considering Equation (3), $p_o \leq \lambda/4$, and replacing the physical constants of Equation 3 known values thereof, Equation (8) becomes the inequality:

$$n_e \geq 1.4 \times 10^8 \lambda^{-2} \sqrt{\frac{V_p}{kT}} \, V_p \qquad (9)$$

in which kT is the electron temperature measured in electron volts. For example, if the mean free path is one millimeter ($10^{-3}$m) and kT=6 eV, $n_e \geq 5.7 \times 10^{16} m^{-3}$.

The microwave generator 28 is adjusted to produce the minimum electron density defined by the above inequality (9).

The selected acceleration voltage $V_p$ is obtained by adjusting the high frequency source 18.

In the microwave discharge the sheaths are of negligible thickness and the plasma potential is very close to ground. By connecting the electrode 6 that carries the substrate 8 to be etched to the HF voltage source 18, an additional sheath of considerable thickness is formed about the electrode and a direct voltage $V_p$ of suitable polarity appears between the electrode and the plasma. This encourages ion bombardment.

The following equation links voltage $V_p$ to the injected alternating current density I/S (S being the total surface area of the electrode in contact with the plasma):

$$V_p = 1.58 \epsilon_o^{-2} e^{-1} n_e^{-2} \omega^{-4} (kT)^{-1} (I/S)^4 \qquad (10)$$

It is not, however, necessary for an operator to measure the alternating current I in order to adjust the apparatus. The voltage $V_p$, in effect, appears between the electrode and ground; it is therefore sufficient to read the direct current $I_A$ passing through the resistance 20 and the ammeter 21 in order to ascertain $V_p$ from the equation:

$$V_p = I_A R \qquad (11)$$

As the microwave generator 28 has been adjusted as indicated above, the condition (3) is obeyed. As long as $V_p$ is less than or equal to a selected value, the ions accelerated towards the substrate are not subjected to collisions in the sheath. If $V_p$ exceeds the selected value, these collisions take place and the etching becomes isotropic.

Lastly, if $V_p$ is too low, the ion bombardment effect becomes negligible and the etching becomes isotropic. It is therefore suitable to set $V_p$ as close as possible to the selected value.

The use of a high frequency alternating voltage for the biasing of the electrode 6 enables the insulating substrates to be biased with respect to the plasma.

The following is a summary of the adjustment method for the apparatus in order to carry out the method of the invention:

the acceleration voltage $V_p$ is selected;

the microwave generator 28 is adjusted to obtain a satisfactory density defined by Inequality (9);

$V_p$ is adjusted by calculating it from the Formula (10) where $I_A$ is the value of the direct current read on ammeter 21.

In FIG. 2, the ceiling of the bell 2 of the vacuum chamber 1 is provided with an aperture with that communicates front portion 32 of a hollow cathode plasma generator 33, this generator comprising a supply and trigger system.

The apparatus is adjusted as in the case of FIG. 1, the hollow cathode having been previously triggered.

The anisotropic etching obtained as indicated enables an increase in the density of the etches on a substrate to be etched and enables the invention to be applied to the manufacture of large scale integration (LSI) circuits.

I claim:

1. An apparatus for etching integrated circuits comprising:
   a generator of a plasma of a gaseous component under low pressure;
   means for controlling the electron density of the plasma formed by said plasma generator;
   a leak tight chamber having a metallic wall and an inner metallic electrode plate for supporting integrated circuits to be etched, said plate being insulated from said wall;
   a high frequency alternating signal generator;
   means for applying said high frequency alternating signal between said electrode and said wall;
   means for measuring the value of the current of said alternating signal; and
   communication means between the plasma generator and the leak tight chamber.

2. An apparatus as claimed in claim 1, wherein the communication means comprises a waveguide between the plasma generator and the leak tight chamber and a coupling iris in said waveguide.

3. An apparatus as claimed in claim 1, wherein the communication means enables the emergence within the interior of the chamber of the front portion of a hollow cathode plasma generator.

4. An apparatus as claimed in claim 1, wherein the electrode plate comprises means for connection to ground, said connection means being a resistance of a high value and an apparatus for measuring direct current intensity.

* * * * *